(12) United States Patent
Kim et al.

(10) Patent No.: US 12,310,216 B2
(45) Date of Patent: May 20, 2025

(54) METHOD OF MANUFACTURING DISPLAY DEVICE AND DISPLAY DEVICE MANUFACTURED ACCORDING TO THE SAME

(71) Applicant: Samsung Display Co., Ltd., Yongin-si (KR)

(72) Inventors: Soodong Kim, Suwon-si (KR); Youngsoo Kwon, Hwaseong-si (KR); Jinwon Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 402 days.

(21) Appl. No.: 17/738,809

(22) Filed: May 6, 2022

(65) Prior Publication Data

US 2023/0028409 A1 Jan. 26, 2023

(30) Foreign Application Priority Data

Jul. 26, 2021 (KR) ........................ 10-2021-0097624

(51) Int. Cl.
*H10K 50/84* (2023.01)
*H10K 59/12* (2023.01)
(Continued)

(52) U.S. Cl.
CPC ............. *H10K 59/38* (2023.02); *H10K 59/12* (2023.02); *H10K 71/00* (2023.02); *H10K 59/1201* (2023.02)

(58) Field of Classification Search
CPC ...... H10K 50/84; H10K 50/85; H10K 50/125; H10K 50/86; H10K 50/115; H10K 50/844; H10K 50/854; H10K 50/865; H10K 59/12; H10K 59/38; H10K 59/1201; H10K 59/80; H10K 59/873; H10K 59/877;
(Continued)

(56) References Cited

U.S. PATENT DOCUMENTS 10,670,901 B2 6/2020 Lee et al.
2020/0388663 A1 12/2020 Lee et al.
(Continued)

FOREIGN PATENT DOCUMENTS

KR 10-2019-0057190 5/2019
KR 10-2020-0135727 12/2020
(Continued)

*Primary Examiner* — Chuong A Luu
(74) *Attorney, Agent, or Firm* — KILE PARK REED & HOUTTEMAN PLLC

(57) ABSTRACT

A method of manufacturing a display device includes forming a color filter layer (CFL), and forming a light control layer (LCL) on the CFL. Forming the LCL includes: forming, on the CFL, preliminary partition parts (PPPs) spaced apart from each other; forming a preliminary light control part (PLCP) by providing a quantum dot (QD) solution between the PPPs, the QD solution including a QD and a base resin; forming a light control part (LCP) by volatilizing the base resin from the PLCP; and forming partition parts by reducing a thickness of the PPPs. A ratio between a first weight ratio (WR) of the QD in the PLCP and a second WR of the QD in the LCP is about 1:1.1 to about 1:3.0. The first WR is a WR of the QD in the entire PLCP, and the second WR is a WR of the QD in the entire LCP.

17 Claims, 8 Drawing Sheets

(51) Int. Cl.
*H10K 59/38* (2023.01)
*H10K 71/00* (2023.01)

(58) Field of Classification Search
CPC .... H10K 59/8792; H10K 71/00; H10K 71/40; H10K 102/00; H10K 102/331; H10K 102/351; G02B 1/04; G02B 5/02; G02B 5/20; G02B 5/201; G02B 5/206; G02B 5/0242
USPC .......................................................... 257/40
See application file for complete search history.

(56) References Cited

U.S. PATENT DOCUMENTS

| | | | |
|---|---|---|---|
| 2021/0408135 A1 | 12/2021 | Kwon et al. | |
| 2022/0278296 A1* | 9/2022 | Hur | H10K 85/657 |
| 2022/0328768 A1* | 10/2022 | Kim | H10K 85/6574 |
| 2023/0019886 A1* | 1/2023 | Han | H10K 59/12 |

FOREIGN PATENT DOCUMENTS

| | | |
|---|---|---|
| KR | 10-2020-0140966 | 12/2020 |
| KR | 10-2022-0000021 | 1/2022 |

* cited by examiner

METHOD OF MANUFACTURING DISPLAY DEVICE AND DISPLAY DEVICE MANUFACTURED ACCORDING TO THE SAME

CROSS-REFERENCE TO RELATED APPLICATIONS

This application claims priority to and the benefit of Korean Patent Application No. 10-2021-0097624, filed Jul. 26, 2021, which is hereby incorporated by reference for all purposes as if fully set forth herein.

BACKGROUND

Field

One or more embodiments generally relate to a method of manufacturing a display device and a display device manufactured according to the same, and more particularly, to a method of manufacturing a display device including a process of forming a light control part and a display device manufactured according to the same.

DISCUSSION

Various display devices, such as a television, a mobile phone, a tablet computer, a navigation unit, a game console, and the like, which are used in, for instance, multimedia devices, have been developed. A display device using a so-called self-emission type display element for realizing a display may emit light by allowing a light emitting material containing an organic compound to emit the light. Accordingly, the display device may include a light control layer for improving a color reproduction property, and the light control layer may be provided by a solution containing a quantum dot. Partition parts may be provided so that quantum dots are not mixed between neighboring pixels, but brightness of the display device may decrease by light absorption of the partition parts.

The above information disclosed in this section is only for understanding the background of the inventive concepts, and, therefore, may contain information that does not form prior art.

SUMMARY

One or more embodiments are capable of providing a method of manufacturing a display device that improves a relative weight of a quantum dot and reduces a thickness of partition parts.

One or more embodiments are capable of providing a display device manufactured by a process that improves a relative weight of a quantum dot and reduces a thickness of partition parts.

Additional aspects will be set forth in the detailed description which follows, and, in part, will be apparent from the disclosure, or may be learned by practice of the inventive concepts.

According to an embodiment, a method of manufacturing a display device includes forming a color filter layer, and forming a light control layer on the color filter layer. Forming the light control layer includes: forming, on the color filter layer, preliminary partition parts spaced apart from each other; forming a preliminary light control part by providing a quantum dot solution between the preliminary partition parts, the quantum dot solution including a quantum dot and a base resin; forming a light control part by volatilizing the base resin from the preliminary light control part; and forming partition parts by reducing a thickness of each of the preliminary partition parts. A ratio between a first weight ratio of the quantum dot in the preliminary light control part and a second weight ratio of the quantum dot in the light control part is about 1:1.1 to about 1:3.0. The first weight ratio is a weight ratio of the quantum dot in the entire preliminary light control part, and the second weight ratio is a weight ratio of the quantum dot in the entire light control part.

According to an embodiment, a display device includes a display element layer, a color filter layer disposed on the display element layer, a light control layer disposed between the display element layer and the color filter layer, and a first capping layer disposed between the color filter layer and the light control layer. The light control layer includes: partition parts spaced apart from each other; a light control part disposed between the partition parts, the light control part including a quantum dot and a base resin; and a second capping layer covering one surface of the light control part that is spaced apart from the color filter layer. The second capping layer does not overlap the partition parts.

The foregoing general description and the following detailed description are illustrative and explanatory and are intended to provide further explanation of the claimed subject matter.

BRIEF DESCRIPTION OF THE FIGURES

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings.

DETAILED DESCRIPTION OF SOME EMBODIMENTS

Figure 1:
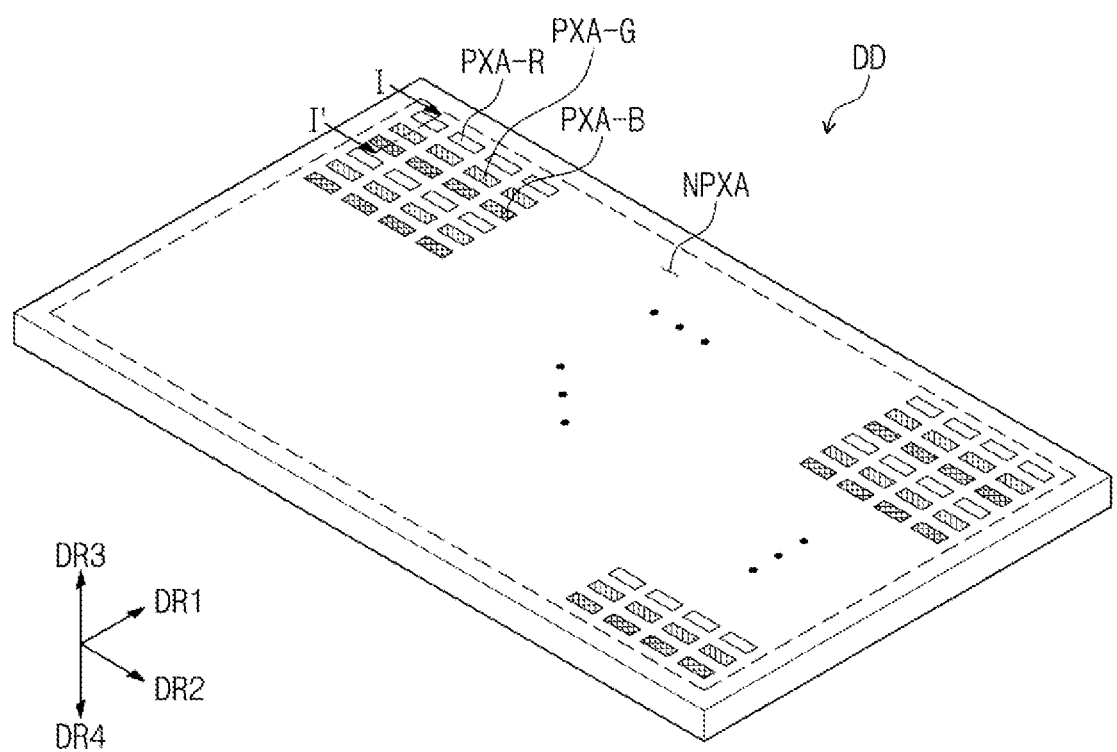
FIG. 1 is a perspective view illustrating a display device according to an embodiment.

In the following description, for the purposes of explanation, numerous specific details are set forth in order to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. For example, "about" may mean within one or more standard deviations, or within ±30%, 20%, 10%, 5% of the stated value.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

Figure 2:
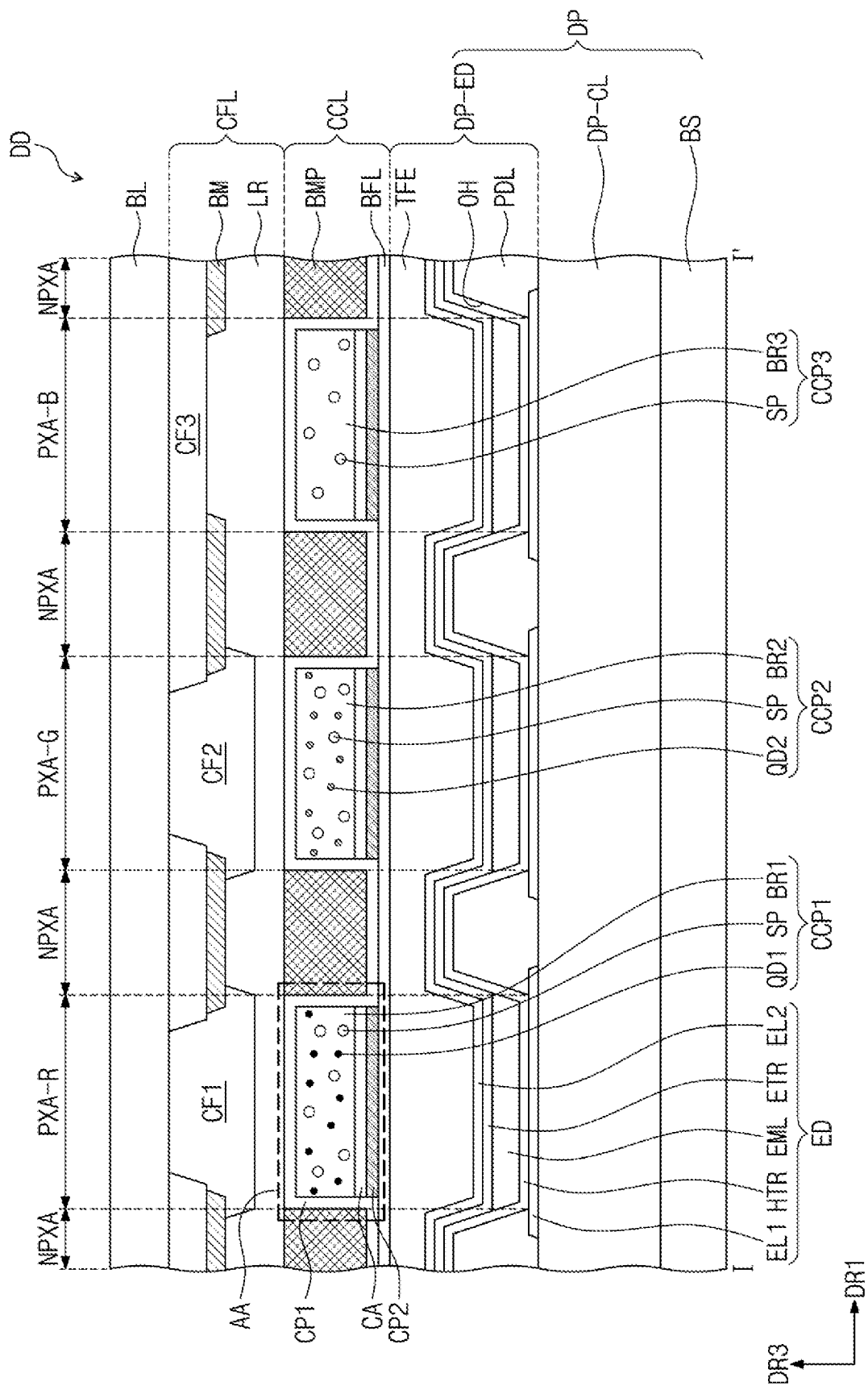
FIG. 2 is a cross-sectional view taken along sectional line I-I' of FIG. 1 according to an embodiment.
Figure 3:
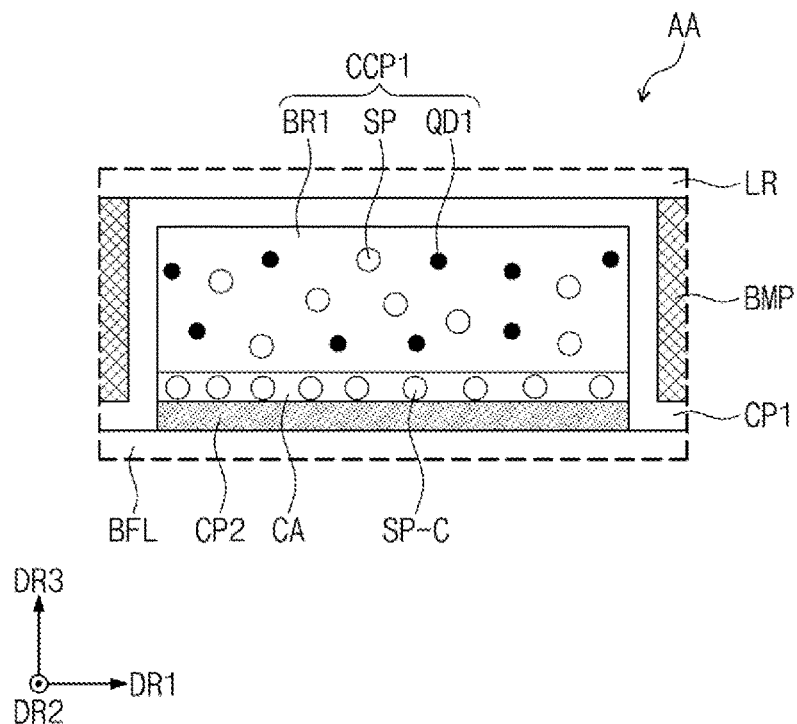
FIG. 3 is a cross-sectional view illustrating a portion corresponding to an area AA of FIG. 2 according to an embodiment.
Figure 4:
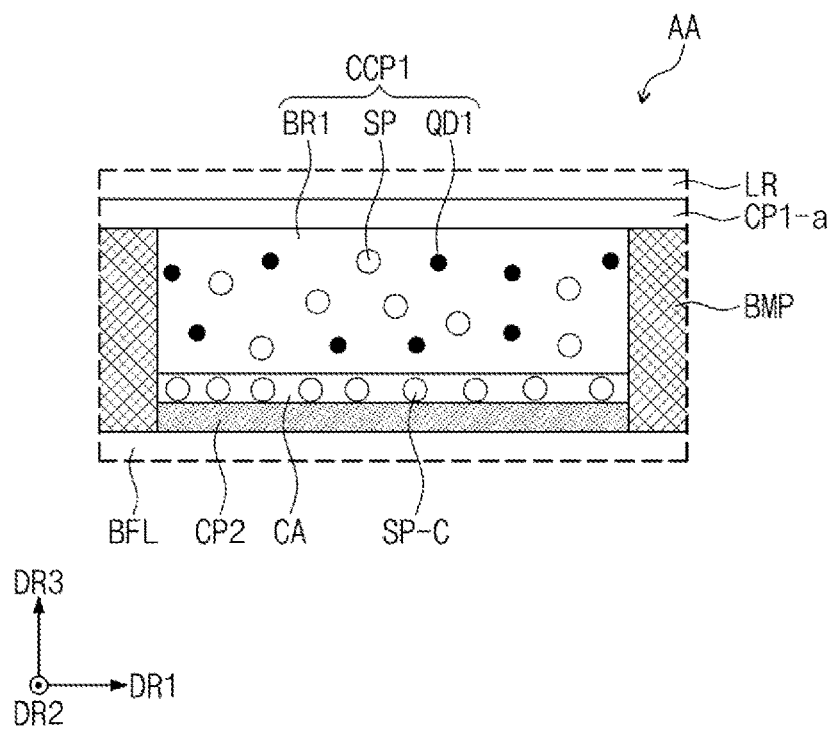
FIG. 4 is a cross-sectional view illustrating a portion corresponding to an area AA of FIG. 2 according to an embodiment.

FIG. 1 is a perspective view illustrating a display device according to an embodiment. FIG. 2 is a cross-sectional view taken along sectional line I-I' of FIG. 1 according to an embodiment. FIGS. 3 and 4 are enlarged cross-sectional views illustrating a portion corresponding to an area AA of FIG. 2 according to some embodiments.

A display device DD according to an embodiment may be activated by an electrical signal. Although the display device DD may be, e.g., a television, a monitor, an outdoor advertising board, a mobile phone, a tablet computer, a navigation unit for a vehicle, a game console, a wearable device, and/or the like, embodiments are not limited thereto.

The display device DD may have a thickness direction parallel to a third directional axis DR3 that is a normal direction with respect to a plane defined by a first directional axis DR1 and a second directional axis DR2. A fourth directional axis DR4 may be parallel to the normal direction with respect to the plane defined by the first directional axis DR1 and the second directional axis DR2, but the fourth directional axis DR4 may be a direction opposite to the third directional axis DR3. In this disclosure, directions indicated by the first to fourth directional axes DR1, DR2, DR3, and DR4 may be relative concepts and converted with respect to each other. Also, directions indicated by the first to fourth directional axes DR1, DR2, DR3, and DR4 may be described as first to fourth directions and designated by corresponding reference numerals. In this disclosure, the first directional axis DR1 and the second directional axis DR2 are perpendicular to each other, and each of the third directional axis DR3 and the fourth directional axis DR4 is a normal direction with respect to the plane defined by the first and second directional axes DR1 and DR2.

Referring to FIGS. 1 and 2, the display device DD may include a non-light emitting area NPXA and light emitting areas PXA-R, PXA-G, and PXA-B. The light emitting areas PXA-R, PXA-G, and PXA-B may be spaced apart from each other on a plane. Each of the light emitting areas PXA-R, PXA-G, and PXA-B may emit light generated from corresponding light emitting elements ED.

Each of the light emitting areas PXA-R, PXA-G, and PXA-B may be distinguished by a pixel defining layer PDL. The non-light emitting area NPXA may be disposed between neighboring light emitting areas PXA-R, PXA-G, and PXA-B, and correspond to the pixel defining layer PDL. The pixel defining layer PDL may distinguish the light emitting elements ED.

Each of the light emitting areas PXA-R, PXA-G, and PXA-B may emit light generated from corresponding ones of the light emitting elements ED. Three light emitting areas PXA-R, PXA-G, and PXA-B respectively emitting red light, green light, and blue light are illustrated as an example in the display device DD. For example, the display device DD according to an embodiment may include a red light emitting area PXA-R, a green light emitting area PXA-G, and a blue light emitting area PXA-B, which are distinguished from each other, but embodiments are not limited thereto. For instance, alternative or additional colors may be provided.

Although each of the light emitting areas PXA-R, PXA-G, and PXA-B have similar surface areas in FIGS. 1 and 2, embodiments are not limited thereto. For example, the light emitting areas PXA-R, PXA-G, and PXA-B may have different surface areas according to wavelength areas of light emitted therefrom. Here, the surface area of each of the light emitting areas PXA-R, PXA-G, and PXA-B may represent a surface area when viewed on a plane defined by the first directional axis DR1 and the second directional axis DR2.

Referring to FIG. 2, the display device DD may include a display panel DP, a light control layer CCL, and a color filter layer CFL disposed on the light control layer CCL. The display panel DP may include a base layer BS, a circuit layer DP-CL disposed on the base layer BS, and a display element layer DP-ED disposed on the circuit layer DP-CL. The display element layer DP-ED may include a pixel defining layer PDL, light emitting elements ED disposed between portions of the pixel defining layer PDL, and an encapsulation layer TFE disposed between the light control layer CCL and the light emitting elements ED.

The base layer BS may be a member for providing a base surface on which the display element layer DP-ED is disposed. The base layer BS may be at least one of a glass substrate, a metal substrate, and a plastic substrate. However, embodiments are not limited thereto. For example, the base layer BS may be an inorganic layer, an organic layer, or a composite material layer. It is also contemplated that the base layer BS may be a single layer or a multilayer structure. For instance, the base layer BS may include a stacked structure of a first inorganic layer, an organic layer, and a second inorganic layer.

In an embodiment, the circuit layer DP-CL may be disposed on the base layer BS and may include a plurality of transistors. Each of the transistors may include a control electrode, an input electrode, and an output electrode. For example, the circuit layer DP-CL may include a switching transistor and a driving transistor for driving light emitting elements ED of the display element layer DP-ED. It is contemplated, however, that any suitable number of transistors may be utilized, as well as other circuit components, such as one or more capacitors.

Each of the light emitting elements ED may include a first electrode EL1, a hole transport region HTR, a light emitting layer EML, an electron transport region ETR, and a second electrode EL2. In some embodiments, each of the light emitting elements ED may include a plurality of light emitting layers. The plurality of light emitting layers may be sequentially laminated (or stacked). For example, the light emitting element including the plurality of light emitting layers may have a tandem structure.

With continued reference to FIG. 2, the light emitting layer EML of each of the light emitting elements ED may be disposed in an opening OH defined in the pixel defining layer PDL. Also, in an embodiment, the hole transport region HTR, the electron transport region ETR, and the second electrode EL2 may be provided as a common layer to each of the light emitting elements ED. However, embodiments are not limited thereto. For example, the hole transport region HTR and the electron transport region ETR may be provided by being patterned in the opening OH defined in the pixel defining layer PDL.

The encapsulation layer TFE may cover the light emitting elements ED. The encapsulation layer TFE may be disposed on the second electrode EL2. The encapsulation layer TFE may seal (e.g., hermetically seal) the display element layer DP-ED. The encapsulation layer TFE may be a thin-film encapsulation layer. The encapsulation layer TFE may include a single layer or a plurality of layers that are laminated. The encapsulation layer TFE may include at least one organic layer and at least one inorganic layer. For instance, the encapsulation layer TFE may include a first inorganic layer, an organic layer, and a second inorganic layer sequentially laminated.

A filling layer BFL may be disposed between the display element layer DP-ED and the light control layer CCL. The filling layer BFL may include an organic material. For example, the filling layer BFL may include at least one of an acrylic-based resin, a silicone-based resin, and an epoxy-based resin.

In some embodiments, a barrier layer maybe further disposed between the light control layer CCL and the filling layer BFL. The barrier layer may serve to block permeation of moisture and/or oxygen. The barrier layer may block light control parts CCP1, CCP2, and CCP3 of the light control layer CCL from being exposed to moisture and/or oxygen.

The light control layer CCL may include a plurality of light control parts CCP1, CCP2, and CCP3. The light control parts CCP1, CCP2, and CCP3 may be spaced apart from each other. Partition parts BMP may be disposed between the light control parts CCP1, CCP2, and CCP3. The partition parts BMP may be or include a black matrix. The partition parts BMP may include, for instance, at least one of an organic light shielding material and an inorganic light shielding material, which contains at least one of a black pigment and a black dye.

The light control parts CCP1, CCP2, and CCP3 may include a first light control part CCP1 containing a first quantum dot QD1 for converting first color light into second color light, a second light control part CCP2 containing a second quantum dot QD2 for converting the first color light into third color light, and a third light control part CCP3 transmitting the first color light therethrough. The first color light may be provided from the light emitting element ED. The first color light may be blue light.

The first light control part CCP1 may provide red light that is the second color light, and the second light control part CCP2 may provide green light that is the third color light. The third light control part CCP3 may provide blue light that is the first color light by transmitting the blue light therethrough. For example, the first quantum dot QD1 may be a red quantum dot, and the second quantum dot QD2 may be a green quantum dot.

A core of the quantum dots QD1 and QD2 may be selected from the group consisting of a group II-VI compound, a group III-VI compound, a group compound, a group III-V compound, a group III-II-V compound, a group IV-VI compound, a group IV element, a group IV compound, and any combination thereof.

Here, a binary compound, a ternary compound, and a quaternary compound may exist in a particle with a uniform concentration or exist in the same particle while being divided in a state in which a concentration distribution is partially different. Alternatively, the quantum dots QD1 and QD2 may have a core-shell structure in which one quantum dot surrounds another quantum dot. The core-shell structure may have a density gradient in which a density of an element existing in the shell gradually decreases in a direction toward the core.

In some embodiments, the quantum dot may have a core-shell structure including a core including a nanocrystal and a shell surrounding the core. The shell of the quantum dot may serve as a protection layer for maintaining a semiconductor characteristic by preventing chemical denaturation of the core and/or as a charging layer for applying an electrophoretic characteristic to the quantum dot. The shell may be a single layer or multiple layers. The shell of the quantum dot may be, e.g., at least one of an oxide of metal or non-metal, a semiconductor compound, and any combination thereof.

The quantum dot may have a full width at half maximum (FWHM) of a light emitting wavelength spectrum, which is equal to or less than about 45 nm, such as equal to or less than about 40 nm, e.g., equal to or less than about 30 nm, and, in one or more of these ranges, a color purity or a color reproduction property may be improved. Also, since light emitted through the above-described quantum dot is emitted in all directions, a wide viewing angle may be improved.

Also, although the quantum dot may have a shape that is generally used in the corresponding field, embodiments are not limited to the shape of the quantum dot. In some embodiments, the quantum dot may have a shape, such as a globular shape, a pyramid shape, a multi-arm shape, or a shape of a nano-particle, a nano-tube, a nano-wire, a nano-fiber, or a nano-plate shaped particle of a cubic.

The quantum dot may adjust a color of emitted light according to particle sizes, and thus, the quantum dot may have various light emitting colors, such as blue, red, and/or green.

In an embodiment, the light control layer CCL may further include a scatterer SP. The first light control part CCP1 may include the first quantum dot QD1 and the scatterer SP, and the second light control part CCP2 may include the second quantum dot QD2 and the scatterer SP. The third light control part CCP3 may not include the quantum dot, and may include the scatterer SP.

The scatterer SP may be inorganic particles. For example, the scatterer SP may include at least one of TiO2, ZnO, $Al_2O_3$, $SiO_2$, and hollow silica. The scatterer SP may include at least one of TiO2, ZnO, $Al_2O_3$, $SiO_2$, and hollow silica or a mixture of at least two selected from the group consisting of TiO2, ZnO, $Al_2O_3$, $SiO_2$, and hollow silica.

Each of the first light control part CCP1, the second light control part CCP2, and the third light control part CCP3 may include a base resin BR1, BR2, and BR3 for distributing the quantum dot QD1 and QD2 and the scatterer SP. The first light control part CCP1 may include the first quantum dot QD1 and the scatterer SP distributed in a first base resin BR1, the second light control part CCP2 may include the second quantum dot QD2 and the scatterer SP distributed in a second base resin BR2, and the third light control part CCP3 may include the scatterer SP distributed in a third base resin BR3. The base resin BR1, BR2, and BR3 may be a medium in which the quantum dots QD1 and QD2 and the scatterer SP are dispersed and made of various resin compositions that are generally referred to as a binder. For example, the base resins BR1, BR2, and BR3 may include at least one of an acrylic-based resin, a urethane-based resin, a silicon-based resin, and an epoxy-based resin. The base resins BR1, BR2, and BR3 may be a transparent resin. The first base resin BR1, the second base resin BR2, and the third base resin BR3 may be the same as or different from at least one other of the base resins.

In an embodiment, a first capping layer CP1 may be disposed between the light control layer CCL and the color filter layer CFL. The light control parts CCP1, CCP2, and CCP3 may be spaced apart from the color filter layer CFL with the first capping layer CP1 therebetween. The first capping layer CP1 may prevent contact between the light control parts CCP1, CCP2, and CCP3 and the color filter layer CFL.

The first capping layer CP1 may overlap the light control layer CCL and the partition parts BMP. The first capping layer CP1 may cover one surface (e.g., a top surface) of the light control parts CCP1, CCP2, and CCP3 disposed adjacent to the color filter layer CFL. The first capping layer CP1 may contact the other surface (e.g., a bottom surface) of the partition parts BMP. Also, the first capping layer CP1 may contact a side surface of the partition parts BMP. However, this is merely illustrative. For example, the first capping layer CP1 may not contact the side surface or the other surface (e.g., the bottom surface) of the partition parts BMP.

A second capping layer CP2 may cover the other surface (e.g., a bottom surface) of the light control parts CCP1, CCP2, and CCP3. The other surface (e.g., the bottom surface) of the light control parts CCP1, CCP2, and CCP3 may be spaced apart from the color filter layer CFL. The one surface (e.g., the top surface) and the other surface (e.g., the bottom surface) of the light control parts CCP1, CCP2, and CCP3 may be spaced apart from each other in a direction parallel to the third directional axis DR3.

Referring to FIG. 3, the second capping layer CP2 may not overlap the partition parts BMP. The second capping layer CP2 may overlap the first light control part CCP1. The second capping layer CP2 may be provided for protecting the first light control part CCP1. Although only the first light control part CCP1 is illustrated in FIG. 3, the second capping layer CP2 may be provided for protecting the first light control part CCP1, the second light control part CCP2, and the third light control part CCP3 as illustrated in FIG. 2. The second capping layer CP2 may overlap the first light control part CCP1, the second light control part CCP2, and the third light control part CCP3.

In an embodiment, a sub-capping layer CA may be further provided between the first light control part CCP1 and the second capping layer CP2. The sub-capping layer CA may not overlap the partition parts BMP. The sub-capping layer CA may be provided for protecting the first light control part CCP1. The sub-capping layer CA may contact the first light control part CCP1. Although only the first light control part CCP1 is illustrated in FIG. 3, the sub-capping layer CA may contact each of the first light control part CCP1, the second light control part CCP2, and the third light control part CCP3 as illustrated in FIG. 2. The sub-capping layer CA may protect the first light control part CCP1, the second light control part CCP2, and the third light control part CCP3.

Also, the sub-capping layer CA may be omitted in the display device DD according to an embodiment. When the sub-capping layer CA is omitted, the second capping layer CP2 may contact the light control parts CCP1, CCP2, and CCP3.

The sub-capping layer CA may include a polymer resin. The sub-capping layer CA may further include a scatterer SP-C (hereinafter, referred to as a sub-scatter). The same description as the above description of the scatterer SP of the light control parts CCP1, CCP2, and CCP3 may be applied to a material used for the sub-scatterer SP-C. The sub-scatterer SP-C of the sub-capping layer CA may be the same as the scatterer SP of the light control parts CCP1, CCP2, and CCP3. Alternatively, the sub-scatterer SP-C of the sub-capping layer CA may be different from the scatterer SP of the light control parts CCP1, CCP2, and CCP3. The sub-capping layer CA may use re-incident light from a low refractive layer LR that will be described later. The sub-scatterer SP-C contained in the sub-capping layer CA scatters the re-incident light so that the re-incident light travels toward an upper portion of the display device DD. Thus, the display device DD may have improved brightness.

Unlike as described in association with FIG. 3, a first capping layer CP1-*a* is not disposed on the other surface (e.g., the bottom surface) of the partition parts BMP as shown in FIG. 4. Also, the first capping layer CP1-*a* is not disposed on the side surface of the partition parts BMP. The first capping layer CP1-*a* may contact the partition parts BMP and the color filter layer CFL. For instance, the first capping layer CP1-*a* may contact one surface (e.g., the top surface) of the partition parts BMP and the other surface (e.g., the bottom surface) of the color filter layer CFL.

Alternatively, when the first capping layer CP1-*a* is not in contact with the other surface (e.g., the bottom surface) of the partition parts BMP, the other surface (e.g., the bottom surface) of the partition parts BMP may contact the filling layer BFL. Also, when the barrier layer is disposed between the filling layer BFL and the light control layer CCL as described above, the other surface (e.g., the bottom surface) of the partition parts BMP may contact the barrier layer.

The first capping layer CP1-*a* may be spaced apart from the second capping layer CP2 with the first light control part CCP1 therebetween. Also, the first capping layer CP1-*a* may be spaced apart from the sub-capping layer CA with the first light control part CCP1 therebetween. Although only the first light control part CCP1 is illustrated in FIG. 4, the first capping layer CP1-*a* and the sub-capping layer CA may be disposed on the other surface (e.g., the bottom surface) of the second light control part CCP2. Also, the first capping layer CP1-*a* and the sub-capping layer CA may be disposed on the other surface (e.g., the bottom surface) of the third light control part CCP3.

In an embodiment, each of the partition parts BMP may have a thickness equal to a sum of a thickness of one of the light control parts CCP1, CCP2, and CCP3, a thickness of the first capping layer CP1 and CP1-*a*, and a thickness of the second capping layer CP2. For example, each of the partition parts BMP may have a thickness equal to a sum of a thickness of the first light control part CCP1, a thickness of the first capping layer CP1 and CP1-*a*, and a thickness of the second capping layer CP2. Each of the partition parts BMP may have a thickness equal to a sum of a thickness of the second light control part CCP2, a thickness of the first capping layer CP1 and CP1-*a*, and a thickness of the second capping layer CP2. Each of the partition parts BMP may have a thickness equal to a sum of a thickness of the third light control part CCP3, a thickness of the first capping layer CP1 and CP1-*a*, and a thickness of the second capping layer CP2.

Alternatively, each of the partition parts BMP may have a thickness different from a sum of a thickness of one of the light control parts CCP1, CCP2, and CCP3, a thickness of the first capping layer CP1 and CP1-*a*, and a thickness of the second capping layer CP2. A difference between the thickness of each of the partition parts BMP and the sum of the thickness of one of the light control parts CCP1, CCP2, and CCP3, the thickness of the first capping layer CP1 and CP1-*a*, and the thickness of the second capping layer CP2 may not affect the thickness of the display device DD.

Referring to FIG. 2 again, the color filter layer CFL may include a light shielding part BM and filters CF1, CF2, and CF3. The color filter layer CFL may include a first filter CF1 transmitting the second color light, a second filter CF2 transmitting the third color light, and a third filter CF3 transmitting the first color light.

For example, the first filter CF1 may be a red filter, the second filter CF2 may be a green filter, and the third filter CF3 may be a blue filter. Each of the filters CF1, CF2, and CF3 may include a polymer photosensitive resin and a pigment or a dye. However, embodiments are not limited thereto. For example, the third filter CF3 may not include a pigment or a dye. The third filter CF3 may be transparent. Also, each of the first filter CF1 and the second filter CF2 may be a yellow filter. The first filter CF1 and the second filter CF2 may be integrated with each other instead of being distinguished, e.g., spaced apart from one another.

The light shielding part BM may be a black matrix. The light shielding part BM may include at least one of an organic light shielding material and an inorganic light shielding material, which contains at least one of a black pigment and a black dye. Alternatively, the light shielding part BM may be a blue filter.

Also, the color filter layer CFL may include a low refractive layer LR. The low refractive layer LR may have a refractive index less than that of each of the color filter layer CFL and the light control layer CCL disposed adjacent thereto. The low refractive layer LR may reflect a portion of blue light emitted in a direction from the light control layer CCL to the color filter layer CFL to be re-incident to the light control layer CCL. The blue light may be emitted from the light emitting element ED of the display element layer DP-ED. A portion of the blue light may be re-incident to the first light control part CCP1 or the second light control part CCP2. The first light control part CCP1 may convert the re-incident blue light into red light, and the second light control part CCP2 may convert the re-incident blue light into green light. The above-described recirculation of light may improve an optical efficiency of the display device DD.

The base substrate BL may be a member providing a base surface on which the light control layer CCL and the color filter layer CFL are disposed. In a method for manufacturing a display device according to an embodiment, which will be described later, the light control layer CCL and the color filter layer CFL may be provided on the base substrate BL.

The base layer BS may be at least one of a glass substrate, a metal substrate, and a plastic substrate. However, embodiments are not limited thereto. For example, the base layer BS may be an inorganic layer, an organic layer, or a composite material layer. It is also contemplated that the base layer BS may be a single layer or a multilayer structure. In some embodiments, the base substrate BL may be omitted.

The display device DD according to an embodiment may be manufactured by a method for manufacturing a display device. Hereinafter, one or more methods for manufacturing the display device according to some embodiments will be described with reference to FIGS. 5 to 11. Hereinafter, when described with reference to FIGS. 5 to 11, the same reference numerals will be given to the same features as those described with reference to FIGS. 2 to 4. In the descriptions of FIGS. 5 to 11, the features overlapped with those described in FIGS. 2 to 4 will not be described again, and different points will be mainly described.

Figure 5:
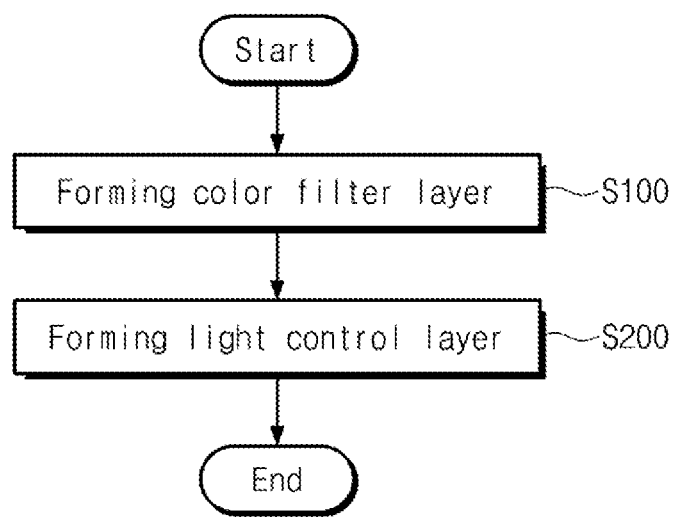
FIG. 5 is a flowchart of a process for manufacturing a display device according to an embodiment.
Figure 6:
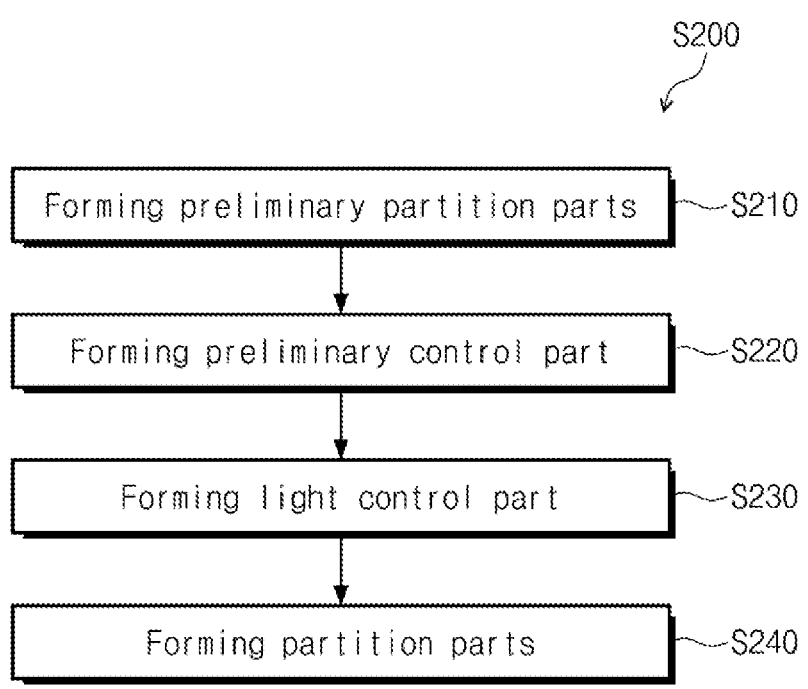
FIG. 6 is a flowchart of a process for manufacturing a display device according to an embodiment.

FIGS. 5 and 6 are flowcharts of processes for manufacturing a display device according to some embodiments. FIGS. 7A, 7B, and 8 to 11 are schematic views illustrating a display device at various stages of manufacture according to some embodiments.

The method for manufacturing the display device according to an embodiment may include a process S100 of forming a color filter layer and a process S200 of forming a light control layer on the color filter layer. The process S200 of forming a light control layer may include a process S210 of forming preliminary partition parts, a process S220 of forming a preliminary control part, a process S230 of forming a light control part, and a process S240 of forming partition parts.

A color filter layer CFL may be formed on a base substrate BL. A plurality of preliminary partition parts P-BMP and BMP-a may be formed on the color filter layer CFL. The preliminary partition parts P-BMP and BMP-a may have a single layer or two or more layers.

Figure 7A:
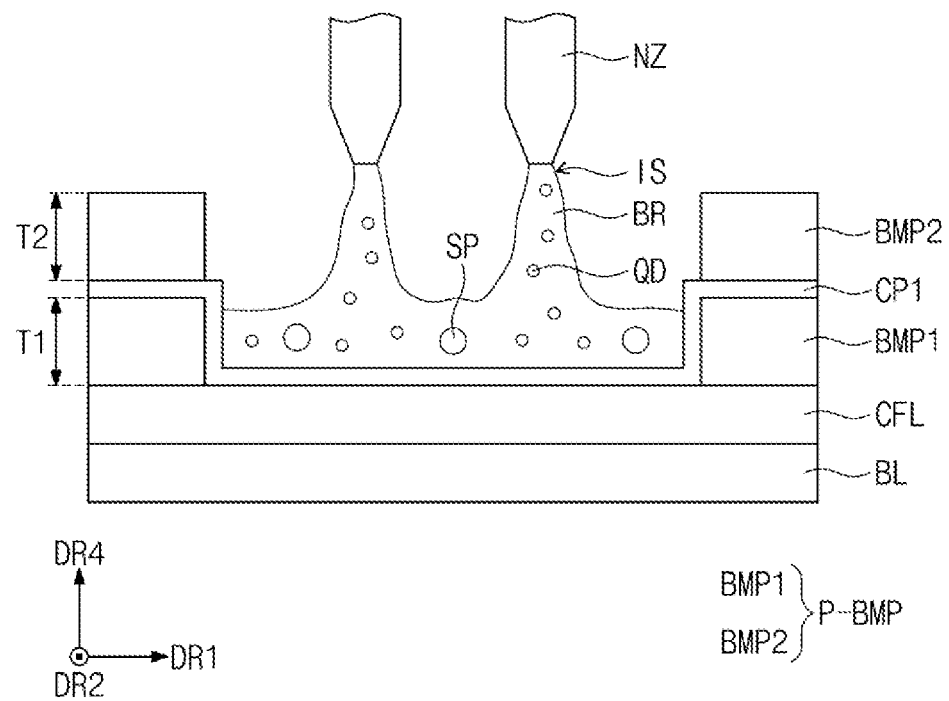
FIG. 7A is a schematic view illustrating a process of manufacturing a display device according to an embodiment.
Figure 7B:
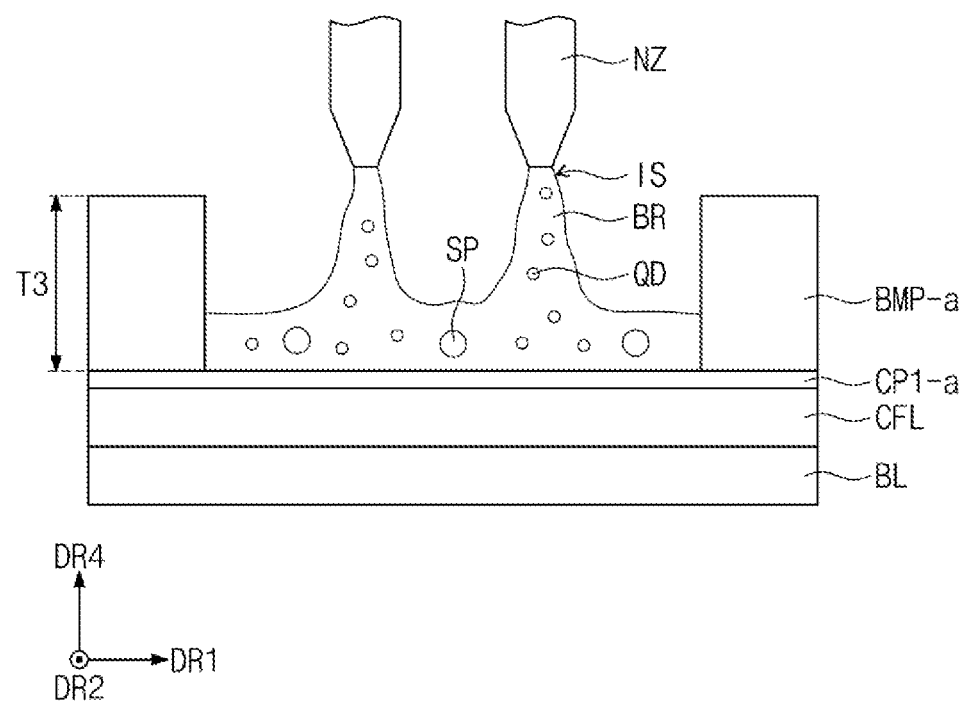
FIG. 7B is a schematic view illustrating a process of manufacturing a display device according to an embodiment.

In FIG. 7A, the preliminary partition parts P-BMP have two layers. Unlike FIG. 7A, the preliminary partition parts BMP-a in FIG. 7B has a single layer. The plurality of preliminary partition parts P-BMP and BMP-a may be spaced apart from each other on a plane. In FIGS. 7A and 7B, the preliminary partition parts P-BMP and BMP-a are spaced apart from each other in a direction parallel to the first directional axis DR1.

Referring to FIG. 7A, each of the preliminary partition parts P-BMP and BMP-a may include a first partition part BMP1 disposed on the color filter layer CFL and a second partition part BMP2 disposed on the first partition part BMP1. A first capping layer CP1 may be disposed between the first partition part BMP1 and the second partition part BMP2. The first partition part BMP1 and the second partition part BMP2 may be spaced apart from each other with the first capping layer CP1 therebetween.

In an embodiment, the process S210 of forming the preliminary partition parts may include a process of forming a plurality of first partition parts BMP1 on the color filter layer CFL, a process of forming the first capping layer CP1 on the first partition parts BMP1, and a process of forming the second partition parts BMP2 on the first partition parts BMP1.

The first capping layer CP1 may be formed by a deposition process. For example, the first capping layer CP1 may be formed by a chemical vapor deposition (CVD) process. The first capping layer CP1 may be made of an inorganic material. Alternatively, the first capping layer CP1 may be made of an organic material. For example, the first capping layer CP1 may be made of a silicon oxynitride (SiON). However, this is merely illustrative, and embodiments are not limited to the material and formation method of the first capping layer CP1.

The first capping layer CP1 may cover one surface of the color filter layer CFL. A light control layer CCL (refer to FIG. 2) may be formed on one surface of the color filter layer CFL. As described above, the first capping layer CP1 may allow the color filter layer CFL and the light control layer CCL (refer to FIG. 2) to be spaced apart from each other. The first capping layer CP1 may prevent contact between the color filter layer CFL and the light control layer CCL (refer to FIG. 2).

The first capping layer CP1 may be formed on the first partition parts BMP1 before the second partition parts BMP2 are formed. One surface of the first partition parts BMP1 may be parallel to a plane defined by the first directional axis DR1 and the second directional axis DR2 and spaced apart from the color filter layer CFL. The one surface of the first partition parts BMP1 may have a hydrophobic property. The second partition parts BMP2 may be formed on the one surface of the first partition parts BMP1. Since the one surface of the first partition parts BMP1 has a hydrophobic property, the second partition parts BMP2 may not be easily formed on the one surface of the first partition parts BMP1.

For example, the preliminary partition parts P-BMP may be formed by coating with photoresist. Since a material for forming an additional partition part is not easily applied onto the one surface of the partition part, which has a hydrophobic property, the partition parts having multilayers are not easily formed. The method for manufacturing the display device according to an embodiment may easily form the second partition parts BMP2 by including a process of depositing the first capping layer CP1 on the first partition parts BMP1.

As the first capping layer CP1 covers the one surface of the first partition parts BMP1, the second partition parts BMP2 may be easily formed. FIG. 3 illustrates a case when the display device is manufactured by depositing the first capping layer CP1 on the first partition parts BMP1 before the second partition parts BMP2 are formed.

The second partition parts BMP2 may be formed on the first partition parts BMP1 with the first capping layer CP1 therebetween. The first capping layer CP1 and the second partition parts BMP2 may be sequentially formed on the first partition parts BMP1. One surface of each of the first partition parts BMP1 may correspond to the other surface of each of the second partition parts BMP2 on a cross-section defined by the first directional axis DR1 and the fourth directional axis DR4. The one surface of the first partition parts BMP1 may be parallel to the plane defined by the first directional axis DR1 and the second directional axis DR2. The other surface of the second partition parts BMP2 may be parallel to the plane defined by the first directional axis DR1 and the second directional axis DR2.

According to an embodiment, the preliminary partition parts P-BMP may have a total thickness T1 and T2 in a range from about 2 µm to about 20 µm, such as about 7 µm to about 15 µm, e.g., about 10 µm to about 12 µm, for instance, about 7 µm to about 20 µm, such as about 2 µm to about 15 µm. Each of the first partition parts BMP1 may have a first thickness T1, and each of the second partition parts BMP2 may have a second thickness T2. A sum of the first thickness T1 and the second thickness T2 may be equal to or greater than about 2 µm and equal to or less than about 20 µm. The first thickness T1 may be equal to or greater than about 1 µm and equal to or less than about 19 µm. The second thickness T2 may be equal to or greater than about 1 µm and equal to or less than about 19 µm. The first thickness T1 of the first partition parts BMP1 and the second thickness T2 of the second partition parts BMP2 may be different from each other. Alternatively, the first thickness T1 of the first partition parts BMP1 and the second thickness T2 of the second partition parts BMP2 may be equal to each other.

Referring to FIG. 7B, the preliminary partition parts BMP-a may be formed by a single layer. The preliminary partition parts BMP-a formed by the single layer may have a third thickness T3. The third thickness T3 may be equal to or greater than about 2 µm and equal to or less than about 20 µm, such as equal to or greater than about 7 µm and equal to or less than about 15 µm, e.g., equal to or greater than about 10 µm and equal to or less than about 12 µm, for instance, equal to or greater than about 7 µm and equal to or less than about 20 µm, such as equal to or greater than about 2 µm and equal to or less than about 15 µm. The third thickness T3 may be equal to the sum of the first thickness T1 and the second thickness T2. When the preliminary partition parts BMP-a are formed by the single layer, the preliminary partition parts BMP-a may have a thickness equal to the sum of the thicknesses of the preliminary partition parts P-BMP.

An amount of a quantum dot QD of a quantum dot solution IS provided in the process S220 of forming the preliminary control part may be varied according to the thickness T1, T2, and T3 of the preliminary partition parts P-BMP and BMP-a. The quantum dot solution IS may be provided between the preliminary partition parts P-BMP and BMP-a that are spaced apart from each other. As the thickness T1, T2, and T3 of the preliminary partition parts P-BMP and BMP-a increases, an amount of the quantum dot solution IS may increase. The more amount of the quantum dot solution IS may include a greater amount of the quantum dot QD.

According to an embodiment, the quantum dot solution IS may be provided between the preliminary partition parts P-BMP and BMP-a. The quantum dot solution IS may be provided by a method of an inkjet printing method or a dispensing coating method, but embodiments are not limited thereto. For example, the quantum dot solution IS may be provided through a nozzle NZ. The quantum dot solution IS may have viscosity in a range from about 2 cP to about 40 cP at room temperature. The viscosity of the quantum dot solution IS may be measured by a rotary type viscometer. The quantum dot solution IS may have surface energy in a range from about 1 dyne/cm to about 40 dyne/cm. The quantum dot solution IS having the viscosity in the range from about 2 cP to about 40 cP may be easily discharged from the nozzle NZ.

The quantum dot solution IS according to an embodiment may include the quantum dot QD and a base resin BR. The quantum dot solution IS may further include a scatterer SP. The quantum dot QD may be the same as the first quantum dot QD1 and/or the second quantum dot QD2 of the display device DD (refer to FIG. 2). The quantum dot solution IS containing the first quantum dot QD1 may be provided to form a first light control part CCP1. The quantum dot solution IS containing the second quantum dot QD2 may be provided to form a second light control part CCP2.

The base resin BR may include a liquid monomer. Also, the base resin BR may further include a solvent. The solvent of the base resin BR may be a volatile material.

The quantum dot solution IS may have a vapor pressure in a range from about $10^{-6}$ mmHg to about 1 mmHg and a boiling point in a range from about 25° C. to about 250° C. The quantum dot solution IS having the vapor pressure in the range from about $10^!$ mmHg to about 1 mmHg and the boiling point in the range from about 25° C. to about 250° C. may exhibit a volatile property. For instance, the quantum dot solution IS having the vapor pressure in the range from about 10⁻¹ mmHg to about 1 mmHg and the boiling point in the range from about 25° C. to about 250° C. may exhibit a volatile property of the base resin BR contained in the quantum dot solution IS.

For example, the base resin BR may include at least one of hexamethylene diacrylate, tetraethylene glycol diacrylate, dipropylene glycol diacrylate, and tripropylene glycol diacrylate. Also, the base resin BR may further include at least one of propylene glycol methyl ether acetate (PGMEA), dimethyl acetamide (DMA), gamma-butyrolactone (GBL), cyclohexyl acetate (CHA), and dipropylene glycol monomethyl ether acetate (DPMA). However, this is merely illustrative, and embodiments are not limited to the material of the base resin BR.

A preliminary light control part P-CCP may be provided between the preliminary partition parts P-BMP and BMP-a. The preliminary light control part P-CCP may be provided in a groove defined by the preliminary partition parts P-BMP and BMP-a. The preliminary light control part P-CCP may fill a space between the preliminary partition parts P-BMP and BMP-a. The preliminary light control part P-CCP may have a thickness greater than that of each of the preliminary partition parts P-BMP and BMP-a. Alternatively, the preliminary light control part P-CCP may have a thickness equal to that of each of the preliminary partition parts P-BMP and BMP-a. Also, the preliminary light control part P-CCP may have a thickness less than that of each of the preliminary partition parts P-BMP and BMP-a. The preliminary light control part P-CCP may be provided between the preliminary partition parts P-BMP and BMP-a to have a thickness maintained by the preliminary partition parts P-BMP and BMP-a. For example, the preliminary light control part P-CCP may be provided to have substantially the same thickness as that of each of the preliminary partition parts P-BMP and BMP-a.

The light control part CCP may be formed as the base resin BR is volatilized from the preliminary light control part P-CCP. The light control part CCP may be one of the first light control part CCP1, the second light control part CCP2, and the third light control part CCP3, which were described above. The first light control part CCP1, the second light control part CCP2, and the third light control part CCP3 may be formed from the preliminary light control part P-CCP. As the base resin BR is volatilized, a first base resin BR1 of the first light control part CCP1, a second base resin BR2 of the second light control part CCP2, and a third base resin BR3 of the third light control part CCP3 may be formed.

The process S230 of forming the light control part may include a process of providing heat to the preliminary light control part P-CCP. The process of providing heat may include one process or two or more processes.

The process of providing heat may include one process of providing heat in a range from about 20° C. to about 100° C., e.g., about 30° C. to about 90° C., such as about 50° C. to about 70° C., for instance about 20° C. to about 80° C., for example, about 40° C. to about 100° C. The heat in the range from about 20° C. to about 100° C. may be provided to the preliminary light control part P-CCP. As the heat in the range from about 20° C. to about 100° C. is provided, the base resin BR of the preliminary light control part P-CCP may be volatilized. The heat in the range from about 20° C. to about 100° C. may be provide in the same process as the process of providing the quantum dot solution IS. Alternatively, the heat in the range from about 20° C. to about 100° C. may be provided after the quantum dot solution IS is provided. Also, the process S230 of forming the light control part may further include a process of vacuum drying after the process of providing the heat.

Alternatively, the process of providing the heat may include two or more processes. The process of providing the heat may include a first heat providing process and a second heat providing process. The first heat providing process may provide heat in a range from about 20° C. to about 150° C., and the second heat providing process may provide heat in a range from about 100° C. to about 200° C. The second heat providing process may be performed after the first heat providing process. As the process of providing the heat includes the first heat providing process and the second heat providing process, the base resin BR may have a more uniform volatilization degree. For instance, when the process of providing the heat to the preliminary light control part P-CCP is performed by two or more processes, the base resin BR may be further uniformly volatilized in the preliminary light control part P-CCP.

Also, a process of cooling heat, such as a cooling process, may be performed between the first heat providing process and the second heat providing process. However, this is merely illustrative, and the process of cooling heat may be omitted.

Figure 9:
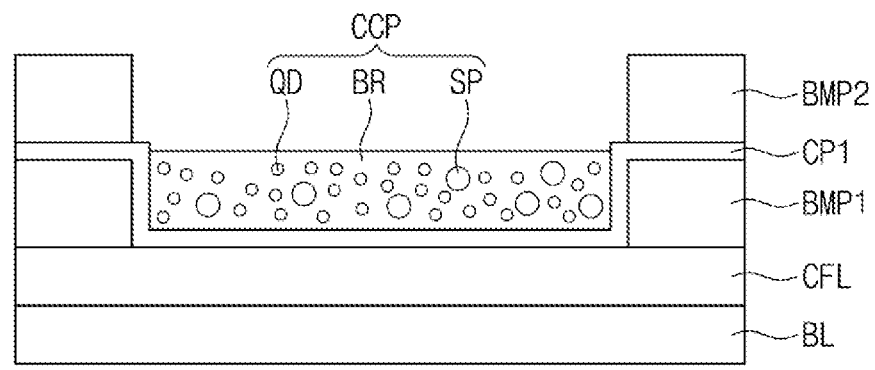
FIG. 9 is a schematic view illustrating a process of manufacturing a display device according to an embodiment.
Figure 9:
Figure 10:
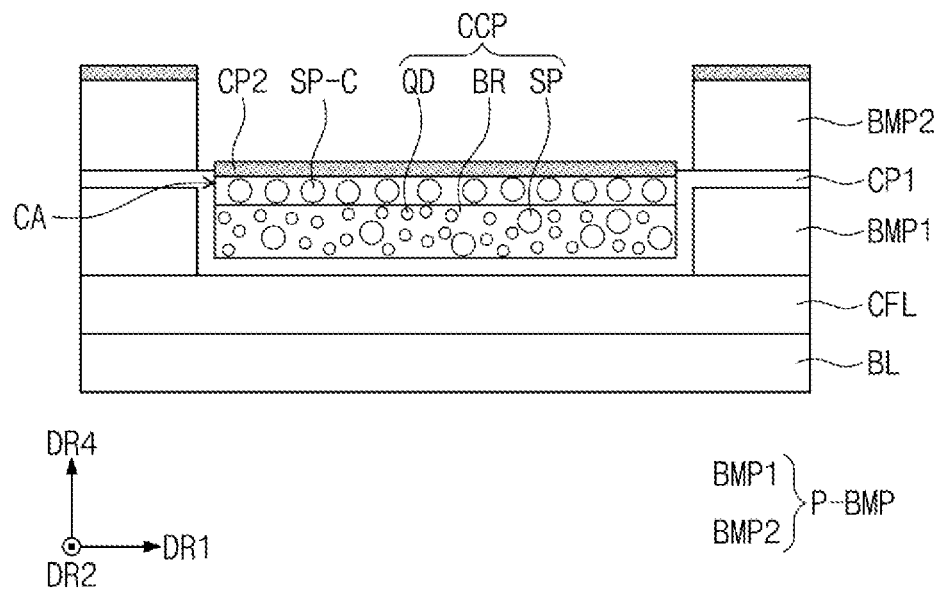
FIG. 10 is a schematic view illustrating a process of manufacturing a display device according to an embodiment.
Figure 11:
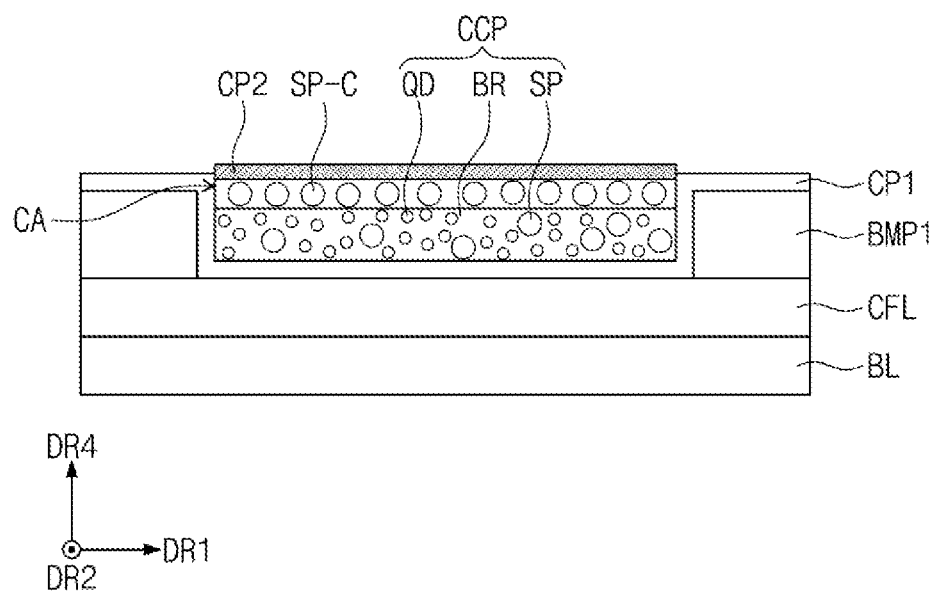
FIG. 11 is a schematic view illustrating a process of manufacturing a display device according to an embodiment.

FIG. 9 illustrates that the light control part CCP is formed as the base resin BR is volatilized from the preliminary light control part P-CCP. A thermal curing process may be performed after the base resin BR is volatilized.

Figure 8:
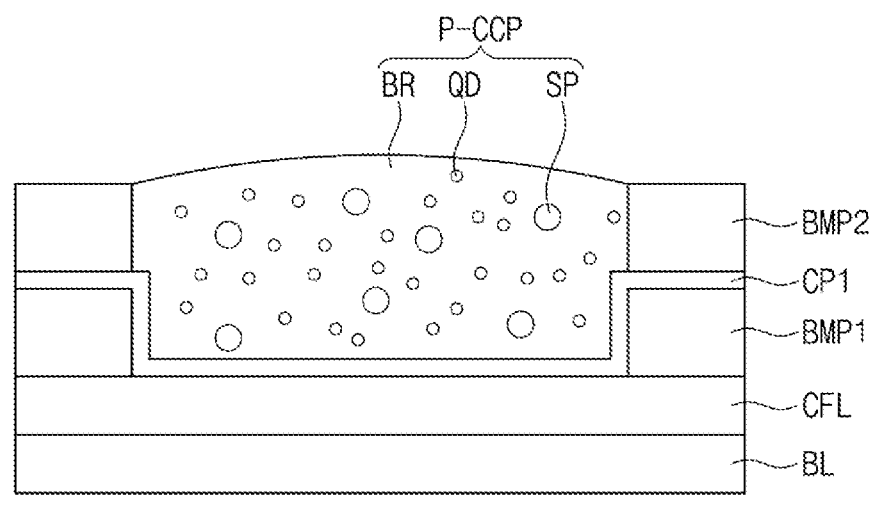
FIG. 8 is a schematic view illustrating a process of manufacturing a display device according to an embodiment.
Figure 8:

According to an embodiment, the quantum dot QD may have a first weight ratio in the preliminary light control part P-CCP and a second weight ratio in the light control part CCP. A ratio between the first weight ratio and the second weight ratio may be about 1:1.1 to about 1:3.0. The second weight ratio may be about 1.1 times to about 3.0 times that of the first weight ratio. The second weight ratio may be greater than the first weight ratio. The first weight ratio may be a weight of the quantum dot QD before the base resin BR is volatilized. The second weight ratio may be a weight of the quantum dot QD after the base resin BR is volatilized. The first weight ratio may be a weight ratio of the quantum dot QD in an entire weight of the preliminary light control part P-CCP. The second weight ratio may be a weight ratio of the quantum dot QD in an entire weight of the light control part CCP. For instance, in an embodiment, a relative weight of the quantum dot may increase as the base resin BR is volatilized. Referring to FIGS. 8 and 9, as the base resin BR is volatilized, a thickness of the light control part CCP may decrease from a thickness of the preliminary light control part P-CCP. For example, the first weight ratio may be in a range from about 5 wt % to about 50 wt %. The second weight ratio may be greater than about 5 wt % and equal to or less than 99 wt %. However, this is merely illustrative, and embodiments are not limited to the first weight ratio and the second weight ratio.

A second capping layer CP2 may be formed on the light control part CCP. The second capping layer CP2 may cover one surface of the light control part CCP. The second capping layer CP2 may minimize a damage of the light control part CCP in a process of removing the preliminary partition parts P-BMP and BMP-a, which will be described later. The second capping layer CP2 may be formed on the second partition part BMP2. Alternatively, the second capping layer CP2 may be formed only on the light control part CCP instead of forming on the second partition part BMP2.

The second capping layer CP2 may be formed by a deposition process. The second capping layer CP2 may be made of an inorganic material. Alternatively, the second capping layer CP2 may be made of an organic material. The second capping layer CP2 may be made of a material different from that of the first capping layer CP1. Alternatively, the second capping layer CP2 may be made of the same material as the first capping layer CP1.

A sub-capping layer CA may cover one surface of the light control part CCP. The sub-capping layer CA may be formed before the second capping layer CP2 is formed. The sub-capping layer CA may be formed before heat is provided to the preliminary light control part P-CCP after the quantum dot solution IS is provided. Also, the sub-capping layer CA may be formed before a curing process is performed after the base resin BR is volatilized as the heat is provided to the preliminary light control part P-CCP. Alternatively, the sub-capping layer CA may be formed after a curing process is performed and the base resin BR is volatilized from the preliminary light control part P-CCP. It is noted, however, that embodiments are not limited to the order of forming the sub-capping layer CA.

The sub-capping layer CA may minimize a damage of the light control part CCP in the process of removing the preliminary partition parts P-BMP and BMP-a, which will be described later. The sub-capping layer CA may be formed by providing a polymer solution onto the light control part CCP. The polymer solution may include a first dispersant, and the first dispersant may include at least one of an acidic substituent and a basic substituent. The polymer solution may include a sub-scatterer SP-C. The quantum dot solution IS may further include a second dispersant, and the second dispersant may include at least one of an acidic substituent and a basic substituent. In an embodiment, the first dispersant may have the same chemical property as the second dispersant. The chemical property of the first dispersant may correspond to one of acidic, basic, and amphoteric properties. The chemical property of the second dispersant may correspond to one of acidic, basic, and amphoteric properties.

For example, when the first dispersant exhibits the acidic property, the second dispersant may exhibit the acidic property. Also, when the first dispersant exhibits the basic property, the second dispersant may exhibit the basic property. Alternatively, when the first dispersant exhibits the amphoteric property, the second dispersant may exhibit the amphoteric property. As the first dispersant and the second dispersant have the same chemical property, the sub-capping layer CA may be formed.

When the first dispersant and the second dispersant have different chemical properties, the first dispersant and the second dispersant may be sunken. When the first dispersant and the second dispersant, which have different chemical properties, react with each other, a precipitation reaction is generated. When the first dispersant exhibits the acidic property, and the second dispersant exhibits the basic property, the first dispersant and the second dispersant are sunken. When the first dispersant exhibits the basic property, and the second dispersant exhibits the acidic property, the first dispersant and the second dispersant are sunken. When the first dispersant exhibits the amphoteric property, and the second dispersant exhibits the acidic or basic property, the first dispersant and the second dispersant are sunken. When the first dispersant exhibits the acidic or basic property, and the second dispersant exhibits the amphoteric property, the first dispersant and the second dispersant are sunken.

The process S240 of forming the partition parts may be performed after the process S230 of forming the light control part. Partition parts BMP may be formed by removing a portion of the preliminary partition parts P-BMP and BMP-a. The partition parts BMP may be formed by reducing the thickness of each of the preliminary partition parts P-BMP and BMP-a. The thickness of each of the preliminary partition parts P-BMP and BMP-a may be reduced as many as a thickness reduced as the base resin BR of the preliminary light control part P-CCP is volatilized. On a cross-section, the light control part CCP may have the same thickness as each of the partition parts BMP. Also, each of the partition parts BMP may have a thickness less than that of the light control part CCP. Alternatively, each of the partition parts BMP may have a thickness greater than that of the light control part CCP. For example, a difference between the thickness of the light control part CCP and the thickness of each of the partition parts BMP may be within about 10%. However, this is merely illustrative, and embodiments are not limited thereto.

When the preliminary partition parts P-BMP includes the first partition part BMP1 and the second partition part BMP2, the second partition part BMP2 may be removed. The second partition part BMP2 disposed at an upper side among the first partition part BMP1 and the second partition part BMP2 that are sequentially laminated on one surface of the color filter layer CFL may be removed. The second capping layer CP2 formed on the second partition part BMP2 may be removed together with the second partition part BMP2. For example, the second partition part BMP2 may be removed by an etching process or a polishing process. The second partition part BMP2 may be removed by a wet etching process. The wet etching process may minimize a damage on a surface of the light control part CCP disposed adjacent to the second partition part BMP2 in comparison with the polishing process. The first partition part BMP1 remained after the second partition part BMP2 is removed may be the partition part BMP (refer to FIG. 2) of the display device DD.

However, this is merely illustrative, and embodiments are not limited to the process of removing the preliminary partition parts P-BMP and BMP-a. Also, after the second partition part BMP2 is completely removed, the first partition part BMP1 may be partially removed.

According to an embodiment, the thickness of each of the preliminary partition parts P-BMP and BMP-a may decrease to a thickness of about 10% to about 90% of an initial thickness thereof by the removing process. For instance, about 10% to about 90% of the initially formed preliminary partition parts P-BMP and BMP-a may be removed by the removing process. As described above, the preliminary partition parts P-BMP may have the thickness T1, T2, and T3 in the range from about 2 μm to about 20 μm. For example, when a sum of the first thickness T1 of the first partition part BMP1 and the second thickness T2 of the second partition part BMP2 is about 20 μm, a thickness of the partition part BMP remained after the removing process may be about 2 μm.

Referring to FIG. 7B again, the preliminary partition parts BMP-a may have the single layer. When the preliminary partition parts BMP-a is formed by the single layer, a first capping layer CP1-a may be formed before the preliminary partition parts BMP-a is formed. The first capping layer CP1-a may cover one surface of the color filter layer CFL before the preliminary partition parts BMP-a are formed on the color filter layer CFL. As described above, the first capping layer CP1 and CP1-a covering the one surface of the color filter layer CFL may prevent contact between the color filter layer CFL and the light control layer CCL. The first capping layer CP1 and CP1-a may prevent contact between the color filter layer CFL and the quantum dots QD1 and QD2. FIG. 4 illustrates a case when the display device is manufactured by depositing the first capping layer CP1-a before the preliminary partition parts BMP-a are formed as illustrated in FIG. 7B.

However, embodiments are not limited thereto. For example, the first capping layer CP1-a may be deposited after the preliminary partition parts BMP-a are formed. In FIGS. 3 and 4, the first capping layer CP1 and CP1-a is provided for preventing contact between the color filter layer CFL and the light control layer CCL. However, embodiments are not limited to the formation order of the first capping layer CP1 and CP1-a in the method for manufacturing the display device.

When the preliminary partition parts BMP-a are formed by the single layer, the preliminary partition parts BMP-a may be removed by a physical process. For example, one surface of the preliminary partition parts BMP-a, which is spaced apart from the color filter layer CFL, may be removed by a polishing process.

In the display device containing the quantum dot, the partition parts having a great thickness are typically required to provide more quantum dots. However, as the thickness of the partition parts increases, a light absorption rate of the partition parts increases, and this causes reduction in brightness of the display device.

The method for manufacturing the display device according to some embodiments may include the process S200 of forming the light control layer, and the process S200 of forming the light control layer may include the process S230 of forming the light control part and the process S240 of forming the partition parts. In the process S230 of forming the light control part, the light control part CCP may be formed by volatilizing the base resin BR from the preliminary light control part P-CCP. As the base resin BR is volatilized, a relative weight of the quantum dot QD in the light control part CCP may increase. As the relative weight of the quantum dot QD increases, the display device DD manufactured by the method for manufacturing the display device according to an embodiment may have improved brightness.

Also, in the process of forming the partition parts BMP, the partition parts BMP may be formed by reducing the thickness T1, T2, and T3 of the preliminary partition parts P-BMP and BMP-a. As the thickness of the partition parts BMP decreases, the light absorption rate of the partition parts BMP may decrease, and the display element layer DP-ED for emitting light and the light control layer CCL may become closer to each other. As a traveling distance of light decreases, a loss amount of light in the light control layer CCL may decrease. Thus, the display device DD manufactured by the method for manufacturing the display device according to an embodiment may have improved brightness.

Figure 12:
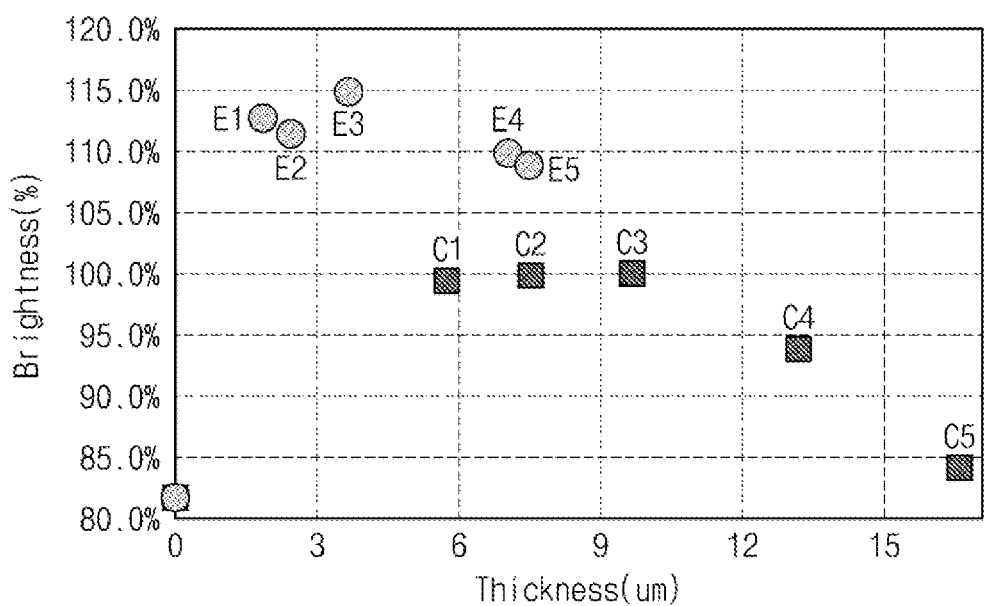
FIG. 12 is a graph showing a result obtained by measuring brightness of display devices according to a comparative example and an embodiment.

FIG. 12 is a graph showing results obtained by evaluating brightness of a display device according to comparative examples 1 to 5 and embodiments 1 to 5. In the graph of FIG. 12, portions indicated by E1 to E5 respectively correspond to display devices of embodiments 1 to 5 manufactured by the method for manufacturing the display device according to an embodiment. Each of the display devices of the embodiments 1 to 5 may be the display device including the light control layer in which the base resin is volatilized, and the thickness of each of the partition parts decreases according to an embodiment. Also, in the graph of FIG. 12, portions indicated by C1 to C5 respectively correspond to display devices of comparative examples 1 to 5. Each of the display devices of the comparative examples 1 to 5 may be the display device including the light control layer in which the base resin is not volatilized, and the thickness of each of the partition parts does not decrease.

In FIG. 12, a brightness value represents a relative brightness value based on brightness of the comparative example 3 when the thickness of the partition part is about 10 μm. For example, FIG. 12 is a graph showing a relative brightness value when the brightness of the comparative example 3 is about 100%. A case of a thickness of about 0 μm represents a relative brightness value before the light control layer is formed in the display device. Table 1 below shows the thickness of the partition part in each of the display devices according to the embodiments 1 to 5 and the comparative examples 1 to 5.

TABLE 1

| Classification | Thickness of partition part |
| --- | --- |
| Embodiment 1 | 2.0 μm |
| Embodiment 2 | 2.5 μm |
| Embodiment 3 | 3.7 μm |
| Embodiment 4 | 7.1 μm |
| Embodiment 5 | 7.5 μm |
| Comparative Example 1 | 5.5 μm |
| Comparative Example 2 | 7.5 μm |
| Comparative Example 3 | 10.0 μm |
| Comparative Example 4 | 13.0 μm |
| Comparative Example 5 | 16.0 μm |

In the graph of FIG. 12, when the comparative examples 1 to 5 are compared with the embodiments 1 to 5, the display devices of the various embodiments have brightness greater than that of the display devices of the comparative examples. When the comparative example 2 is compared with the embodiments 4 and 5, e.g., when the thicknesses of the partition parts are similar to each other, the display device of each of the embodiments 4 and 5, in which the base resin is volatilized, may have relatively greater brightness than the display device of the comparative example 2 in which the base resin is not volatilized. As the base resin is volatilized, a weight ratio of the quantum dot increases, and relatively greater brightness is exhibited.

Referring to the embodiments 3 to 5, as the thickness of each of the partition parts decreases, the brightness may increase. Also, when the comparative example 3 is compared with the embodiment 1, brightness of the embodiment 1 may increase by about 15% in comparison with that of the comparative example 3. As the thickness of each of the partition parts decreases, a light absorption rate of the partition parts decreases, and the brightness of the display device is enhanced. Thus, the display device including the light control parts formed by volatilizing the base resin and the partition parts having a reduced thickness according to an embodiment may exhibit improved brightness.

The method for manufacturing the display device according to an embodiment may include the process of forming the light control layer, and the process of forming the light control layer may include the process of forming the light control part and the process of forming the partition parts. The process of forming the light control part may volatilize the base resin from the quantum dot solution for forming the light control part and increase the relative weight of the quantum dot. As the base resin is volatilized, the thickness of the light control part may decrease. The thickness of the partition parts may decrease as many as the reduced thickness of the light control parts. As the thickness of the partition parts decreases, the light absorption rate of the partition parts may decrease. Thus, the display device manufactured by the method for manufacturing the display device according to an embodiment may exhibit improved brightness.

Also, the display device manufactured by the method for manufacturing the display device according to an embodiment may include the second capping layer for covering the light control part. The second capping layer may prevent damage of the light control part.

The method for manufacturing the display device according to an embodiment may improve the relative weight of the quantum dot and reduce the thickness of each of the partition parts by including the process of forming the light control part and the process of forming the partition parts.

The display device according to an embodiment may exhibit improved brightness by including the quantum dot having the improved relative weight and the partition part having the reduced thickness.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A method for manufacturing a display device, the method comprising:
    forming a color filter layer; and
    forming a light control layer on the color filter layer,
    wherein forming the light control layer comprises:
        forming, on the color filter layer, preliminary partition parts spaced apart from each other;
        forming a preliminary light control part by providing a quantum dot solution between the preliminary partition parts, the quantum dot solution comprising a quantum dot and a base resin;
        forming a light control part by volatilizing the base resin from the preliminary light control part; and
        forming partition parts by reducing a thickness of each of the preliminary partition parts,
    wherein a ratio between a first weight ratio of the quantum dot in the preliminary light control part and a second weight ratio of the quantum dot in the light control part is about 1:1.1 to about 1:3.0, and
    wherein the first weight ratio is a weight ratio of the quantum dot in the entire preliminary light control part, and the second weight ratio is a weight ratio of the quantum dot in the entire light control part.

2. The method of claim 1, wherein:
    forming the light control part comprises providing heat to the preliminary light control part; and
    providing the heat to the preliminary light control part comprises:
        providing heat in a range from about 20° C. to about 100° C. through a single process; or
        providing first heat in a range from about 20° C. to about 150° C. and providing second heat in a range from about 100° C. to about 200° C.

3. The method of claim 2, wherein forming the light control part further comprises a vacuum drying process after provision of the heat.

4. The method of claim 1, wherein forming the partition parts comprises reducing a thickness of each of the preliminary partition parts to a thickness of about 10% to about 90% of an initial thickness of each of the preliminary partition parts.

5. The method of claim 1, wherein forming the partition parts comprises removing, by an etching process or a polishing process, one surface of the preliminary partition parts that is spaced apart from the color filter layer.

6. The method of claim 1, wherein:
    each of the preliminary partition parts comprises:
        a first partition part disposed on the color filter layer; and
        a second partition part disposed on the first partition part; and
    forming the partition parts comprises removing the second partition part of each of the preliminary partition parts by an etching process or a polishing process.

7. The method of claim 1, wherein:
    forming the light control layer further comprises forming a first capping layer by a deposition process before forming the preliminary light control part; and
    the first capping layer is disposed between the color filter layer and the preliminary light control part.

8. The method of claim 1, wherein forming the preliminary partition parts comprises:
    forming first partition parts on the color filter layer;
    forming a first capping layer on the first partition parts; and
    forming second partition parts on the first partition parts, respectively, with the first capping layer disposed therebetween.

9. The method of claim 1, further comprising:
    forming, after forming the light control part, a second capping layer by a deposition process,
    wherein the second capping layer covers one surface of the light control part that is spaced apart from the color filter layer.

10. The method of claim 1, further comprising:
    forming, after forming the light control part, a sub-capping layer by providing a polymer solution,
    wherein the sub-capping layer covers one surface of the light control part that is spaced apart from the color filter layer.

11. The method of claim 10, wherein:
    the polymer solution comprises a first dispersant comprising at least one of an acidic substituent and a basic substituent;
    the quantum dot solution comprises a second dispersant comprising at least one of an acidic substituent and a basic substituent; and
    the first dispersant has a same chemical property as the second dispersant.

12. The method of claim 11, wherein the polymer solution further comprises a scatterer.

13. The method of claim 1, wherein the base resin comprises at least one of hexamethylene diacrylate, tetraethylene glycol diacrylate, dipropylene glycol diacrylate, and tripropylene glycol diacrylate.

14. The method of claim 13, wherein the base resin further comprises at least one of propylene glycol methyl ether acetate (PGMEA), dimethyl acetamide (DMA), gamma-butyrolactone (GBL), cyclohexyl acetate (CHA), and dipropylene glycol monomethyl ether acetate (DPMA).

15. The method of claim 1, wherein each of the preliminary partition parts has a thickness in a range from about 2 μm to about 20 μm.

16. The method of claim 1, wherein the quantum dot solution has viscosity in a range from about 2 cP to about 40 cP at room temperature and surface energy in a range from about 1 dyne/cm to about 40 dyne/cm.

17. The method of claim 1, wherein the quantum dot solution has a vapor pressure in a range from about $10^{-6}$ mmHg to about 1 mmHg and a boiling point in a range from about 25° C. to about 250° C.

* * * * *